(12) United States Patent
Wong

(10) Patent No.: US 6,169,503 B1
(45) Date of Patent: Jan. 2, 2001

(54) PROGRAMMABLE ARRAYS FOR DATA CONVERSIONS BETWEEN ANALOG AND DIGITAL

(75) Inventor: Sau C. Wong, Hillsborough, CA (US)

(73) Assignee: SanDisk Corporation, Sunnyvale, CA (US)

( * ) Notice: Under 35 U.S.C. 154(b), the term of this patent shall be extended for 0 days.

(21) Appl. No.: 09/159,704

(22) Filed: Sep. 23, 1998

(51) Int. Cl.$^7$ ................................................ H03M 1/00
(52) U.S. Cl. ........................................................ 341/136
(58) Field of Search ............................................ 341/136

(56) References Cited

U.S. PATENT DOCUMENTS

| | | | |
|---|---|---|---|
| 4,231,022 | 10/1980 | Kosugi et al. | 340/347 D |
| 4,311,988 | 1/1982 | Kelley et al. | 340/347 D |
| 4,404,544 | 9/1983 | Dwarakanath | 340/347 D |
| 4,550,425 | 10/1985 | Andersen et al. | 381/30 |
| 4,839,923 | 6/1989 | Kotzin | 381/31 |
| 5,369,407 | 11/1994 | Yung et al. | 341/172 |
| 5,376,935 | * 12/1994 | Seligson | 341/136 |
| 5,694,356 | * 12/1997 | Wong et al. | 365/185.03 |
| 5,748,533 | * 5/1998 | Dunlap et al. | 365/185.19 |

FOREIGN PATENT DOCUMENTS 0 798 739  * 10/1997  (EP) .

OTHER PUBLICATIONS

Wong et al., A 0.9 V 5 MS/s CMOS D/a converter with multi–input floating–gate MOS, Proceedings of the IEEE 1997 Custom Integrated Circuits Conference, May 5–8, 1997, pp. 305–308, IEEE Catalog No. 97CH36005.*

* cited by examiner

Primary Examiner—Howard L. Williams
(74) Attorney, Agent, or Firm—Majestic, Parsons, Siebert & Hsue

(57) ABSTRACT

Converters such as digital-to-analog converters (DACs) and analog-to-digital converters (ADCs) use conversion arrays containing non-volatile memory cells to provide references that depend on the threshold voltages of the memory cells. The array contains sets (for example, rows) of the memory cells where each memory cell in a set corresponds to a digital value and has a threshold voltage that is equal to the analog voltage mapped to the digital value. An ADC applies an analog input signal to the gates of reference cells in a set and generates a digital signal according to which of the memory cells conduct. The ADC does not require comparators and has a low circuit area, low power consumption, and high speed. A DAC selects a memory cell corresponding to a digital input value and reads the memory cell to generate an analog output signal equal to the threshold voltage of the memory cell. An ADC and a DAC can use the same conversion array to ensure that the ADC inverts the conversion that the DAC performs. Programming the threshold voltages of memory cells in the conversion array selects or changes the conversion performed and can implement linear and non-linear conversions.

14 Claims, 6 Drawing Sheets

PROGRAMMABLE ARRAYS FOR DATA CONVERSIONS BETWEEN ANALOG AND DIGITAL

BACKGROUND

1. Field of the Invention

This invention relates to converters such as analog-to-digital converters, digital-to-analog converters, and general signal converters and relates to use of non-volatile semiconductor memory cells in a converter to provide linear, non-linear, or user programmable conversions of signals.

2. Description of Related Art

Many systems convert signals from one format to another. For example, audio and image processing systems often use analog-to-digital converters (ADCs) to convert analog audio or image signals to digital samples for digital processing and subsequently uses digital-to-analog converters (DACs) to convert processed digital data to analog signal to be played or displayed. Some memory systems also use ADCs and DACs. For example, U.S. Pat. No. 5,745,409, entitled "Non-Volatile Memory with Analog and Digital Interface and Storage", which is hereby incorporated by reference in its entirety, describes memory systems that store both digital and analog data and include ADCs and DACs for data conversions. As described in U.S. Pat. Nos. 5,638,320 and 5,745,409, some multiple-bit-per-cell memories include a DAC that converts an input multi-bit digital signal representing data into a voltage (or an analog signal) that controls programming of a threshold voltage in a memory cell to store the data in the memory cell. In such memories, reading determines the threshold voltage of the memory cell, and an ADC converts the threshold voltage to the original digital data.

FIG. 1 is a block diagram of a conventional ADC 100 that includes a reference voltage source 110, comparators 120, and an encoder 130. In ADC 100, reference voltage source 110 includes series connected resisters R0 to Rx that generate x reference voltages V0 to Vx where x is equal to $2^n-1$. To convert an analog input signal Ain into an n-bit digital output signal Dout, comparators 120 simultaneously compare analog signal Ain to reference voltages V0 to Vx. Each comparator 120 asserts an associated one of binary signals C0 to Cx to encoder 130 if the reference voltage input to the comparator is greater than the voltage of signal Ain, and encoder 130 provides digital output signal Dout with a value that depends on which of signals C0 to Cx that are high. The number of comparators (x) in ADC 100 depends exponentially on the number of bits (n) in signal Dout. Accordingly, for applications requiring a large number of bits, ADC 100 requires many comparators, and the circuit area and power required for ADC 100 can be significant.

DACs are generally less complex than ADCs. FIG. 2 shows a DAC 200 including a reference voltage source 110, a decoder 230 that receives a digital input signal Din, and transistors 220 coupled between reference voltages V0 to Vx and a terminal for an analog output signal Aout. To perform a digital-to-analog conversion, converter 220 receives digital input signal Din and selects and turns on a transistor 220 that corresponds to the value of signal Din. Accordingly, analog output signal Aout has a voltage equal to the one of reference voltages V0 to Vx that corresponds to the selected transistor 220.

Many other implementations of ADCs and DACs are known. For example, some ADCs and DACs use switched capacitance and successive approximation techniques. Generally, these converters require substantial overhead and circuit area. Some types of DACs which may occupy less circuit area than DAC 200 employ amplifiers and resistors. For example, an amplifier having resistors R0 to R(n−1) connected to form an analog adder can generate an analog output signal Aout having voltage is linearly proportional to the value that bit signals D0 to D(n−1) applied to the resistors represent. For this, each resistor Ri for i from 0 to n−1 has a resistance $2^i * R$ where R is a constant resistance. In an integrated circuit, constructing resistors R0 to R(n−1) that have precise relative resistances over the broad range required when n is large can be difficult.

Another difficulty is that some applications require a DAC and an ADC that precisely match each other. Specifically, some multiple-bits-per-cell memories require an ADC that precisely inverts a conversion that a DAC performs so that the results of an analog-to-digital conversion following a digital-to-analog conversion does not change an input digital data value. This requirement can add to the difficulty in manufacturing resistors having the appropriate resistances. Using the same reference voltage source 110 for both DAC 200 and ADC 100 simplifies matching of the conversions, but still requires the large circuit area and high power draw for the many comparators 120 in ADC 100.

Current systems need converters that have small circuit area for low manufacturing cost, have high speed and low power requirements for low power and portable systems, can be easily constructed, can be easily matched to converters that perform inverse conversions, and can be easily embedded in integrated circuits providing a true system-within-a-chip with analog and digital capabilities.

SUMMARY

In accordance with the invention, converters such as digital-to-analog converters (DACs) and analog-to-digital converters (ADCs) use conversion arrays containing non-volatile memory or reference cells having a set of threshold voltages that provide references for conversions. A conversion array may be divided into multiple subsets of the reference cells where each reference cell in a subset corresponds to a digital value and has a threshold voltage that is equal to the analog voltage that a conversion maps to the digital value. An ADC applies an analog input signal to the gates of reference cells in a subset and generates a digital signal according to which reference cells conduct. In particular, when the analog input signal is applied, each reference cell has a binary state, either conductive or non-conductive, and generation of the digital signal simply requires digital encoding of binary signals indicating the states of the reference cells. With this approach, the ADC does not require comparators which can significantly reduce the size, power consumption, and the conversion time of the ADC. A DAC that contains a conversion array selects a memory cell corresponding to a digital input value and reads the selected memory cell to generate an analog output signal having a voltage equal to the threshold voltage of the memory cell. The DAC can use the same conversion array as an ADC to ensure that the DAC inverts the conversion that the ADC performs.

The conversion array may include ROM cells where the structure (e.g., channel dopant concentration) of each ROM cell sets the cell's threshold voltage or electrically programmable non-volatile memory cells. The set of threshold voltage in the conversion array controls the conversion or conversions implemented. In particular, a converter can implement linear and/or non-linear conversions. Electrically programming the threshold voltages of memory cells in a conversion array allows selection or changes in the conversion if an application of the converter so requires. An end user or a supplier of converter integrated circuits can use a programmer or an automatic tester with appropriate software to program or reprogram a converter when required.

One embodiment of the invention is a converter that includes a plurality of transistors having a plurality of different threshold voltages. For analog-to-digital conversions, an input circuit for the converter applies an analog input signal to gates of the transistors, and an encoder generates a digital output signal that represents a value that depends on which of the transistors conduct when the analog input signal is applied. The transistors are typically floating gate transistors or other transistors having programmable threshold voltages, and the transistors may be in an array including multiple rows and columns of memory cells. In one embodiment, the transistors are in a conversion array having multiple rows, where each row contains transistors with a sequence of threshold voltages that defines a different conversion. A conventional row decoder can select a row accessed from the conversion array during a conversion and thereby select from among multiple conversions implemented in the converter.

The converter optionally includes a read circuit that reads a threshold voltage of a transistor and generates an analog output signal having a voltage that indicates the threshold voltage read. A select circuit receives a digital input signal and selects a memory cell that is in the conversion array and corresponds to the value of the digital input signal. The read circuit reads the selected memory cell so that the converter implements a digital-to-analog conversion.

Another converter in accordance with the invention is a digital-to-analog converter including: a plurality of transistors having a plurality of different threshold voltages; a read circuit capable of reading a threshold voltage of a transistor and generating an output signal that has a voltage that indicates the threshold voltage read; and a select circuit coupled to the plurality of transistors and the read circuit. The select circuit selects which of the plurality of transistors the read circuit reads, the selection being according to a multi-bit digital input signal.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with an aspect of the invention, a converter includes a non-volatile memory array (sometimes referred to herein as a conversion array) that provides programmable references for signal conversions. The conversion array, being programmable, allows the user or manufacturer to select or change the conversion or conversions implemented in the converter at any time, much like the "In System Programming" (ISP) for programmable logic devices. In particular, an analog-to-digital converter (ADC) or a digital-to-analog converter (DAC) can be programmed for linear or non-linear conversions between analog voltage levels and digital values. Further, an ADC and a DAC use the same conversion array, in a manner that makes a conversion that one converter performs the inverse of the conversion that the other converter performs and thereby ensures data conversion integrity. Use of the same conversion array also reduces total circuit area. Converters using the conversion arrays are easily incorporated in integrated circuit memories because reference cells in the conversion array can be structurally the same as memory cells and the converters can use the same write and read circuitry used for accessing data in memory cells.

Figure 3:
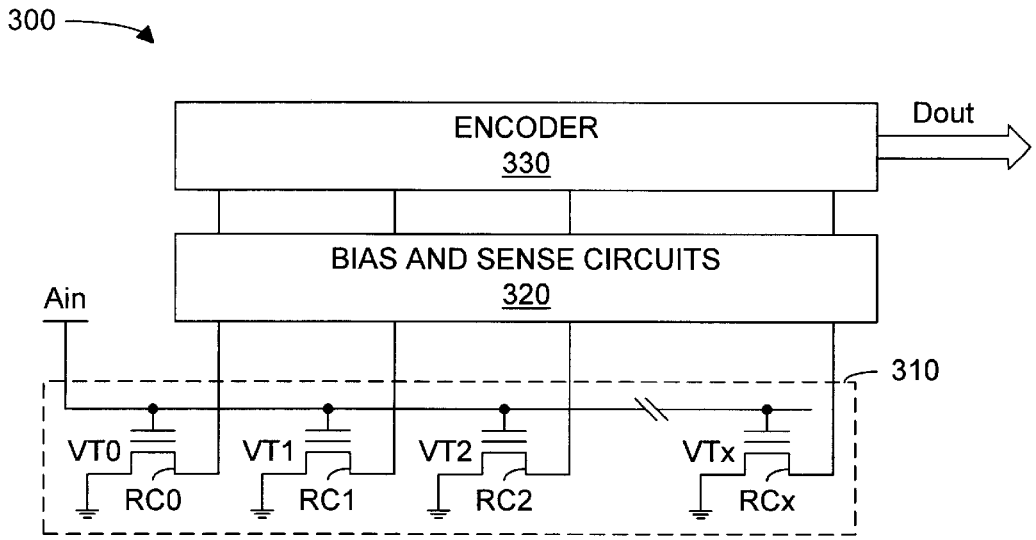
FIGS. 3, 4, 5A, and 5B are block diagrams of programmable analog-to-digital converters in accordance with three embodiments of the invention.

In accordance with an aspect of the invention illustrated in FIG. 3, an ADC 300 does not required comparators and therefore has a small circuit area, a low power consumption, and high speed. ADC 300 includes a conversion array 310 containing reference cells RC0 to RCx with respective threshold voltages VT0 to VTx. The number x is equal to $2^n-1$ where n is the number of bits in an output signal Dout from ADC 300. In FIG. 3, each reference cell RCi, for i between 0 and x, is an N-channel floating gate transistor that is electrically programmed to an associated threshold voltage VTi, but alternative embodiments use other types of memory cells. Memory cells having electrically programmable threshold voltages permit changing or reprogramming of a conversion as described below, but ROM cells having threshold voltages that are set or fixed during circuit fabrication are also suitable. Reference cells RC0 to RCx have control gates coupled together by a row line to form a row. ADC 300 uses a row of reference cells to facilitate simultaneous application of the same control gate voltage to all reference cells RC0 to RCx. Other array configurations are possible, particularly in embodiments of ADC 300 that do not require simultaneous application of the same control gate voltage to all reference cells. The drains of reference cells RC0 to RCx are coupled to an encoder 330.

During operation of ADC 300, the sources of reference cells RC0 to RCx are grounded, bias and sense circuits 320 bias the drains of reference cells RC0 to RCx at a positive voltage, and the control gates of reference cells RC0 to RCx receive an analog input signal Ain to be converted. The reference cells that have threshold voltages lower than the voltage of analog input signal Ain conduct which causes output signals from sense amplifiers to go high. Encoder 330 determines which of reference cells RC0 to RCx conduct and based on that determination generates a digital output signal Dout.

Figure 4:
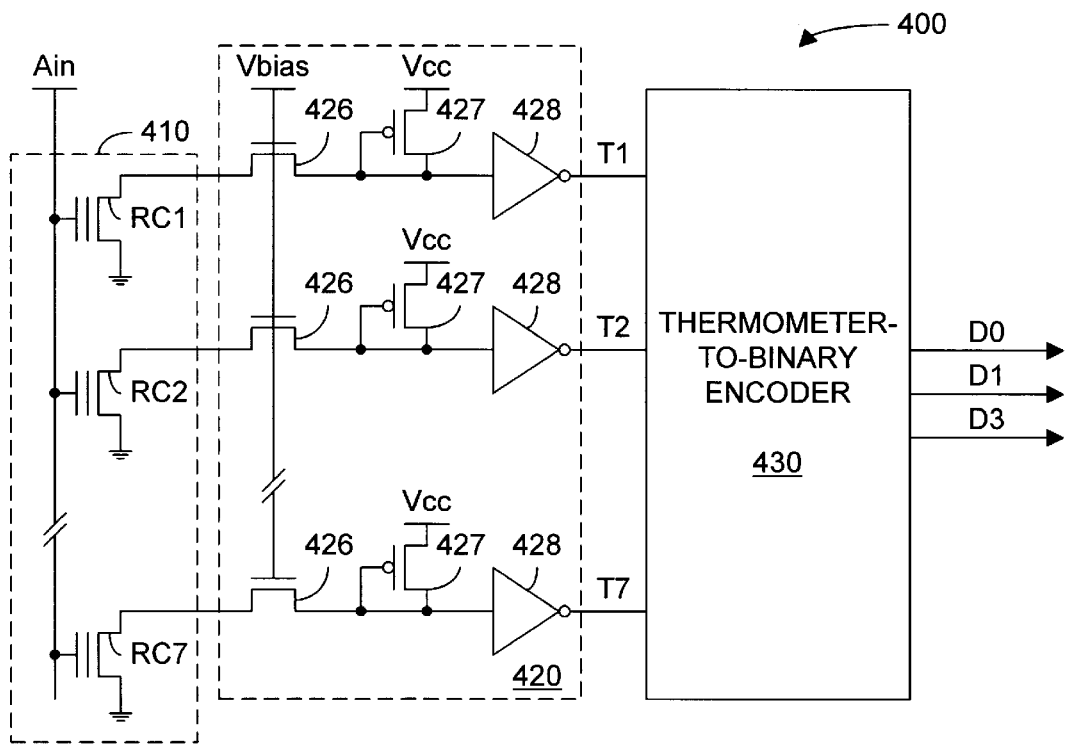

FIG. 4 shows an illustrative embodiment of an ADC 400 having a conversion array 410 for converting an analog input signal Ain to a 3-bit digital output signal Dout. Array 410 includes seven reference cells RC1 to RC7. Alternatively, as illustrated in FIG. 3, a conversion array for an n-bit data output signal includes $2^n$ reference cells RC0 to RCx that respectively correspond to digital values zero to $2^n-1$. However, reference cell RC0 is not required if any analog voltage below the threshold voltage of reference cell RC1 is presumed to have value zero.

In ADC 400, bias and sense circuits 420 include drain-coupled p-channel pull-up transistors 427 and n-channel cascoding transistors 426 for biasing reference cells RC1 to RC7 in an array 410. Pull-up transistors 427 have drains and gates connected together and sources coupled to a supply voltage BCC (typically about 3 or 5 volts). Each cascoding transistor 426 has a gate bias voltage Vbias of about 1.5 volts and serves to connect the drain of an associated reference cell to the drain of an associated pull-up transistor 427. Each pull-up transistor 427 maintains a high voltage on the input terminal of an associated inverter 428 unless an associated reference cell conducts. When a reference cell coupled to the drain of a pull-up transistor 427 conducts, the reference cell pulls down the voltage on the input terminal of the associated inverter 428. Thus, inverters 428 output binary signals T1 to T7 indicating whether respective reference cells RC1 to RC7 conduct.

Encoder 430 generates output signal Dout from binary signals T1 to T7. For ADC 400, encoder 430 is a thermometer-to-binary encoder that generates a 3-digital output signal Dout indicating which of reference cells RC1 to RC7 conduct. Thermometer-to-binary encoder 330 implements the digital encoding listed in Table 1.

TABLE 1

Thermometer-to-Binary Encoding

| Thermometer | | | | | | | Binary | | |
|---|---|---|---|---|---|---|---|---|---|
| T1 | T2 | T3 | T4 | T5 | T6 | T7 | D2 | D1 | D0 |
| 0 | 0 | 0 | 0 | 0 | 0 | 0 | 0 | 0 | 0 |
| 1 | 0 | 0 | 0 | 0 | 0 | 0 | 0 | 0 | 1 |
| 1 | 1 | 0 | 0 | 0 | 0 | 0 | 0 | 1 | 0 |
| 1 | 1 | 1 | 0 | 0 | 0 | 0 | 0 | 1 | 1 |
| 1 | 1 | 1 | 1 | 0 | 0 | 0 | 1 | 0 | 0 |
| 1 | 1 | 1 | 1 | 1 | 0 | 0 | 1 | 0 | 1 |
| 1 | 1 | 1 | 1 | 1 | 1 | 0 | 1 | 1 | 0 |
| 1 | 1 | 1 | 1 | 1 | 1 | 1 | 1 | 1 | 1 |

Methods for designing digital logic which implements the encoding of Table 1 are well known.

Figure 5A:
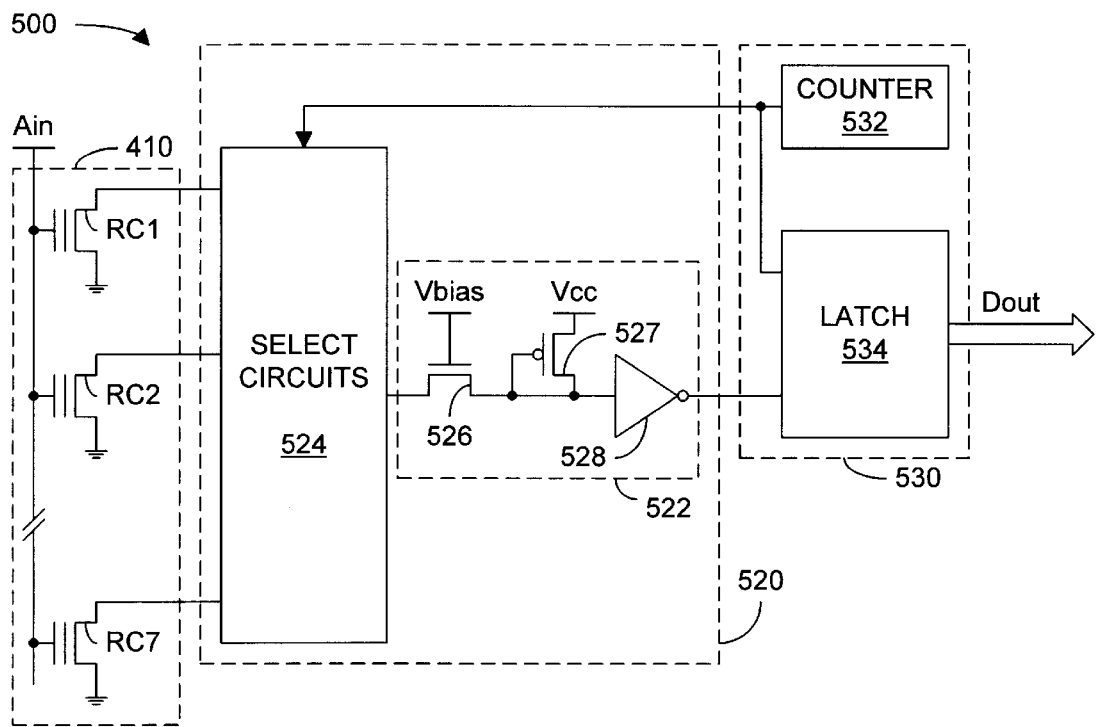

FIG. 5A illustrates an ADC 500 having a conversion array 410, sense and bias circuits 520, and an encoder 530 in accordance with another embodiment of the invention. For ADC 500, bias and sense circuits 520 sequentially determine the conductivity state of each of reference cells RC1 to RC7 in array 410 while analog input signal Ain is applied to the control gates of reference cells RC1 to RC7. (Again the example of a 3-bit digital output signal is described, but digital output signal Dout can have any size through appropriate expansion of conversion array 410 and circuits 520 and 530.) For the sequential determination, bias and sense circuits 320 include select circuits 524 and a sense circuit 522. Select circuits 524 include a column decoder that selects a reference cell that an address signal identifies. Such column decoders are well known for memories. When select circuit 524 selects a reference cell, sense circuit 522 determines the conductivity state of the selected reference cell. Encoder 530 generates digital output signal Dout from a serial signal indicating the conductivity states of the reference cells. Sequentially biasing or testing reference cells in this fashion can significantly reduce the required power and the required circuit area when compared to sensing all of the reference cells in parallel. In particular, ADC 500 requires only a single sense circuit 522 rather instead of $2^n$ sense circuits which operate in parallel to simultaneously determine all of the conductivity states.

In the illustrated embodiment of ADC 500, sense circuit 522 includes transistors 526 and 527, and an inverter 528. Alternatively, ADC 500 could use any other type sense circuit such as those that are well known for memories.

Select circuits 524 select a reference cell according to the address signal and connect the selected reference cell through transistor 526 to the input node of inverter 527. Pull-up transistor 527 pulls up the voltage on the input terminal of inverter 528 unless the selected reference cell conducts. When the selected reference cell conducts, the reference cell pulls down the voltage on the input terminal of inverter 528. Thus, the output signal from inverter 528 indicates whether the currently selected reference cell conducts.

Encoder 530 includes a counter 532 and a multi-bit latch 534. Counter 532 provides the address signal to select circuits 524 in bias and sense circuits 520. For signal conversion, a clock signal causes counter 532 to sequentially count up from zero. When the count in counter 532 crosses the boundary between the addresses of conductive reference cells and the addresses of non-conductive reference cells, a transition in the output signal from inverter 528 causes latch 534 to register the count signal from counter 532. This count signal is the digital output signal Dout. For example, if that input signal Ain has a voltage at or just above the threshold voltage VT2 of reference cell RC2, input signal Ain should be converted to the digital value two. When this level of signal Ain is applied, reference cells RC1 and RC2 conduct, and reference cells RC3 to RC7 do not conduct. Initially, the count zero selects reference cell RC1. Reference cell RC1 conducts and causes inverter 528 to assert a high signal to latch 534. In the next clock cycle, the count one selects reference cell RC2. The reference cell RC2 conducts and causes inverter 528 to maintain the high signal to latch 534. In the following clock cycle, the count two selects reference cell RC3. Reference cell RC3 does not conduct and therefore causes inverter 528 to drop the signal to latch 534. The transition in the signal to latch 534 causes latch 534 to register the count signal from counter 532. Thus, digital output signal Dout represents the value two. Counting can continue or be stopped while latch 534 holds the output value.

Embodiments of ADCs that sequentially determine the conductivity of reference cells can be implemented in a variety of ways. For example, counter 532 in ADC 500 can be replaced with circuitry that performs a binary search for the boundary between conducting and non-conducting reference cells. An exemplary binary search starts at a central address (e.g., 4 for a 3-bit value) and increases or decreases the address depending on whether the reference cell at the current address conducts. The step size (e.g., initially 2) for each change in address decreases by half after each step. Such binary searching can reduce the maximum number of clock cycles required to find the output value, from $2^n-1$ to n.

Figure 5B:
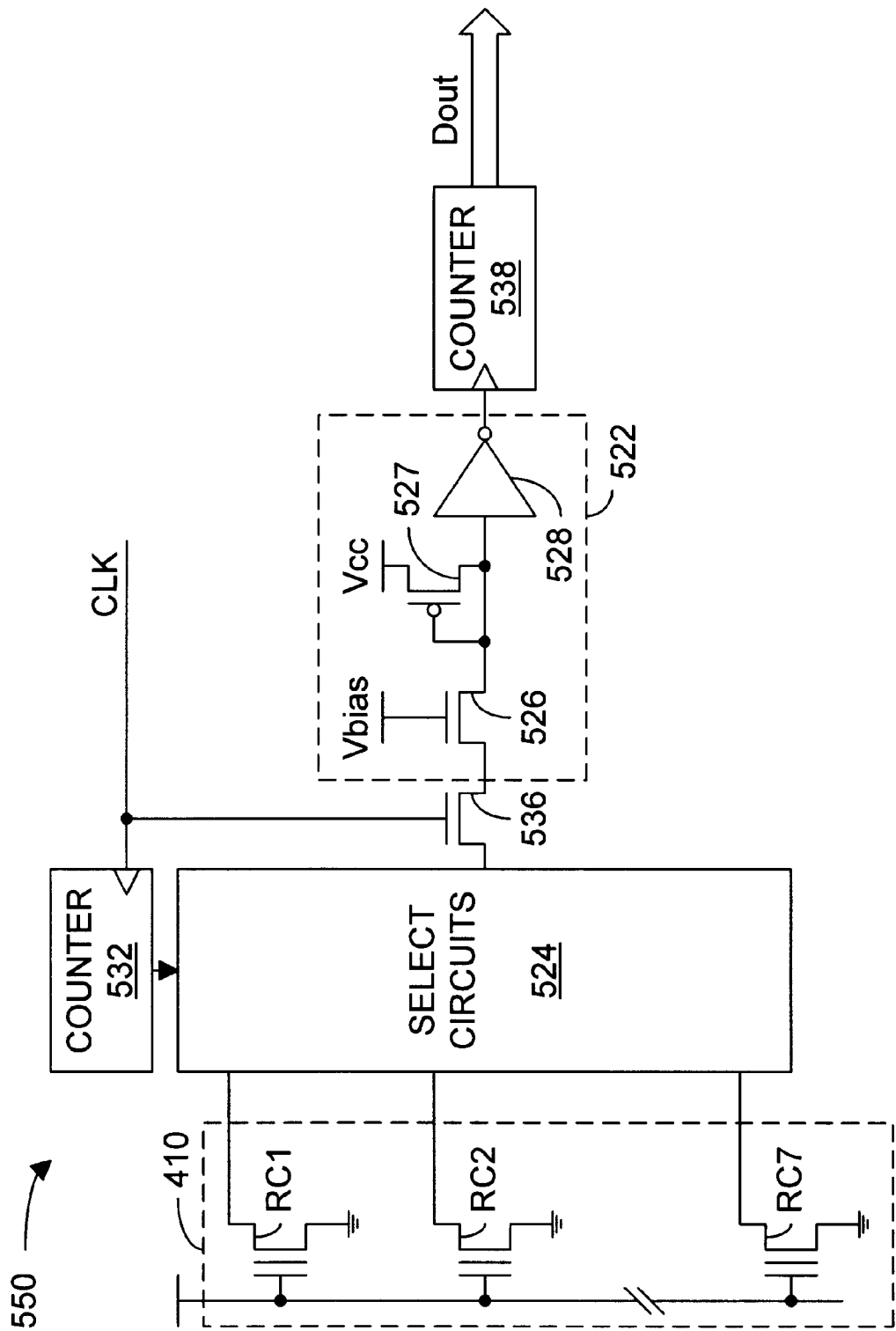

FIG. 5B illustrates alternative ADC 550 that also has select circuits 524 and sense circuit 522 sequentially select and sense the conductivity states of reference cells RC1 to RC1. ADC 550 differs from ADC 500 in that a counter 538, instead of latch 534, provides digital output signal Dout. In ADC 550, counters 532 and 538 are initially reset to zero. Counter 532, in response to a clock signal CLK, sequentially counts through the column addresses of array 410 so that select circuits 524 sequentially connect reference cells RC1 to RC7 to sense circuit 522. In particular, at a rising edge of signal CLK, counter 532 increments the address to select circuit 524, and sense circuit 522 connects to the selected reference cell via a transistor 536 and select circuits 524. If the selected reference cell conducts, the selected reference cell pulls down the voltage on the input terminal of inverter 528, and the output signal from inverter 528 is high. Transistor 536 has a gate coupled to signal CLK so that when signal CLK is low, transistor 536 disconnects sense circuit 522 from select circuits 524 and array 410, pull-up transistor 527 pulls up the input voltage to inverter 528, and the output signal from inverter 528 is low. Accordingly, sense circuit 522 generates a pulse for each reference cell RC1 to RC7 that conducts. Counter 538 counts pulses from sense circuit 522 and outputs the resulting count as signal Dout.

Another alternative to ADC has a conversion array including a column of reference cells that are associated with a conversion. Instead of simultaneously applying analog input voltage Ain to all of the reference cells associated with a conversion, the ADC applies signal Ain only to reference cell (or one row of reference cells) at a time. For this embodiment, bias and select circuits include a row decoder to select the reference cell (or row of reference cells) to which signal Ain is applied. A sense circuit couples to the column line of the column associated with the conversion and to an encoder such as described above for FIGS. 5A and 5B.

An advantage of the above described ADCs is that circuit structure does not set the exact type of conversion. Programming the threshold voltage of reference cells VT0 to VTx sets or changes the type of conversion. For a linear conversion, the voltage of input signal Ain is proportional to the value that digital signal Dout represents, and threshold voltages VT0 to VTx increase linearly. Specifically, if analog signal Ain is in a voltage range from Vmin to Vmax, the threshold voltage VTi for i from 0 to x is given in Equation 1.

$$VTi = i*(Vmax-Vmin)/x + Vmin \qquad \text{Equation 1}$$

With the threshold voltage relationships of Equation 1, reference cell RC0 has a threshold voltage equal to the minimum input voltage Vmin and should conduct for all values of input signal Ain. If reference cell RC0 does not conduct, an error has occurred. Redundant conversion arrays or redundant rows or columns in the same conversion array can be used to detect errors in the ADC and to replace the primary conversion array when such errors are detected. When errors originate outside the ADC, reference cell RC0 can be used to determine whether signal Ain is at or above the minimum voltage Vmin. Alternatively, reference cell RC0 can be omitted, and digital signal Dout represents the value zero when none of the reference cells RC1 to RCx conduct.

More generally, threshold voltages VTi according to Equation 2 implement a conversion where signal Ain is in the voltage range from Vmin to Vmax and the value that signal Dout represents is equal to a function F of the voltage of signal Ain.

$$VTi = F(i*(Vmax-Vmin)/x + Vmin) \qquad \text{Equation 2}$$

Generally, over its range, function F should have a single-valued inverse for an invertable analog-to-digital conversion, but any desired function F can be implemented when the encoder determines the value of signal Dout from the last reference cell to conduct. Well known $\mu$-law and A-law companding schemes illustrate one particular type of function of particular interest. In accordance with an aspect of the invention, proper programming of threshold voltages VT0 to VTx can implement a $\mu$-law and A-law companding ADC or any other companding schemes.

An integrated circuit including ADC 300, 400, or 500 can include on-chip programming circuitry (not shown) that allows a user to program the threshold voltages of reference cells RC0 to RCx and select a desired or custom conversion. Such programming circuits are well known in the field of non-volatile memory. Alternatively, a circuit vendor or an end user can program threshold voltages VT0 to VTx with off-chip programming circuitry such as a custom programmer, a gang programmer or an automatic tester, which simultaneously programs multiple devices. This makes the converter programmable without increasing its circuit area.

Figure 6:
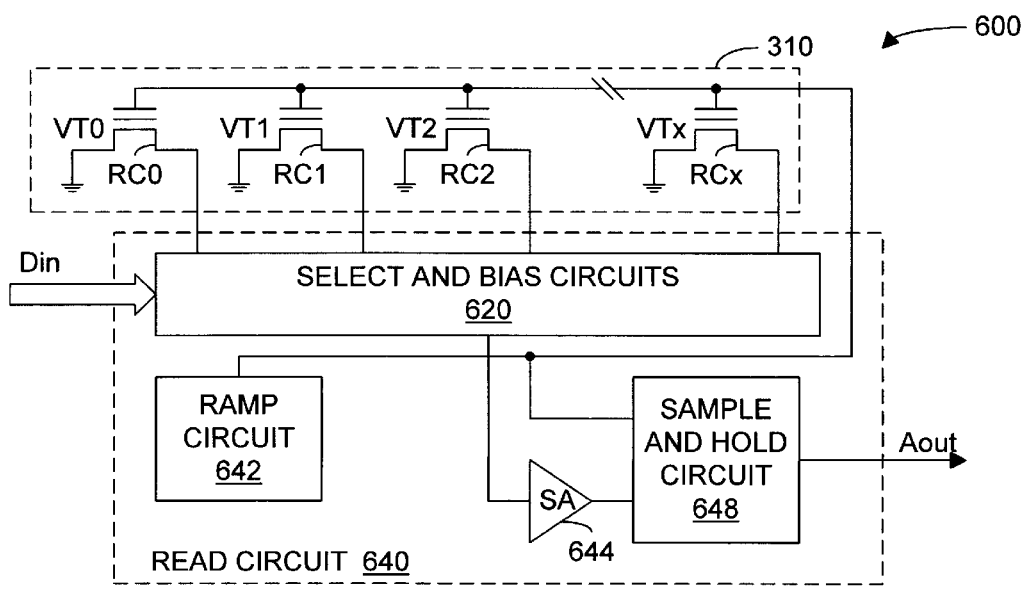
FIG. 6 is a block diagram of a programmable digital-to-analog converter in accordance with an embodiment of the invention.

FIG. 6 illustrates a DAC 600 in accordance with an embodiment of the invention. DAC 600 includes a conversion array containing reference cells RC0 to RCx and a read circuit 640 for selecting one of reference cells RC0 to RCx and determining the threshold voltage of the selected reference cell. Reference cells RC0 to RCx are as described above in regard to FIG. 3, but in DAC 600, reference cells RC0 to RCx have sources grounded and drains coupled to select and bias circuits 620 in read circuit 640. For a conversion of an n-bit digital input signal Din, select circuit 620 interprets digital input signal Din as an address that identifies the selected reference cell. Read circuit 640 then determines the threshold voltage of the selected reference cell and provides analog output signal Aout at a voltage that is the same as (or alternatively depends on) the threshold voltage of the selected reference cell. Thus, the threshold voltage VTi is equal to (or alternatively controls) the voltage of analog output signal Aout when digital input signal Din represents the value i, and programming of threshold voltages VTi controls the conversion that DAC 600 implements.

Read circuit 640 can be any sort of circuit capable of reading a threshold voltage of a memory cell or transistor. However, in the specific embodiment shown in FIG. 6, read circuit 640 includes select and bias circuits 620, a ramp circuit 642, a sense amplifier 644, and a sample-and-hold circuit 648. For a digital-to-analog conversion, select circuit 620 responds to a multi-bit digital signal Din by: selecting the reference cell having an address corresponding to signal Din; biasing the drain of the selected reference cell at a positive voltage, for example, 1 to 1.5 volts; and connecting the drain of the selected reference cell to sense amplifier 644. Ramp circuit 642, which is coupled to the row line of conversion array 310, ramps (increases or decreases) the control gate voltage of selected reference cell between voltages Vmin and Vmax. Sense amplifier 644, which is coupled to the selected reference cell, senses when the selected reference cell transitions between a non-conducting and a conducting state and triggers sample-and-hold circuit 648 upon sensing the transition. In response to sense amplifier 644, sample-and-hold circuit 648 samples the control gate voltage from ramp circuit 642 and provides analog signal Aout with a voltage equal to the sampled voltage. Thus, after some time delay, analog output signal Aout is about equal to the threshold voltage of the selected reference cell.

Although FIG. 6 shows a specific embodiment of read circuit 640, other types of read circuits that are capable of determining a threshold voltage can be used. U.S. Pat. No. 5,751,635, entitled "Read Circuits for Analog Memory Cells"; U.S. Pat. No. 5,748,534, entitled "Feedback Loop for Reading Threshold Voltages"; U.S. Pat. No. 5,748,533, entitled "Read Circuit which Uses a Coarse-to-Fine Search when Reading the Threshold Voltage of a Memory Cell"; and U.S. patent application Ser. No. 09/053716, entitled "High Resolution Multi-Bit-Per-Cell Memory", filed Apr. 1, 1998 describe some other suitable read circuits and are hereby incorporated by reference in their entirety.

Figure 7A:
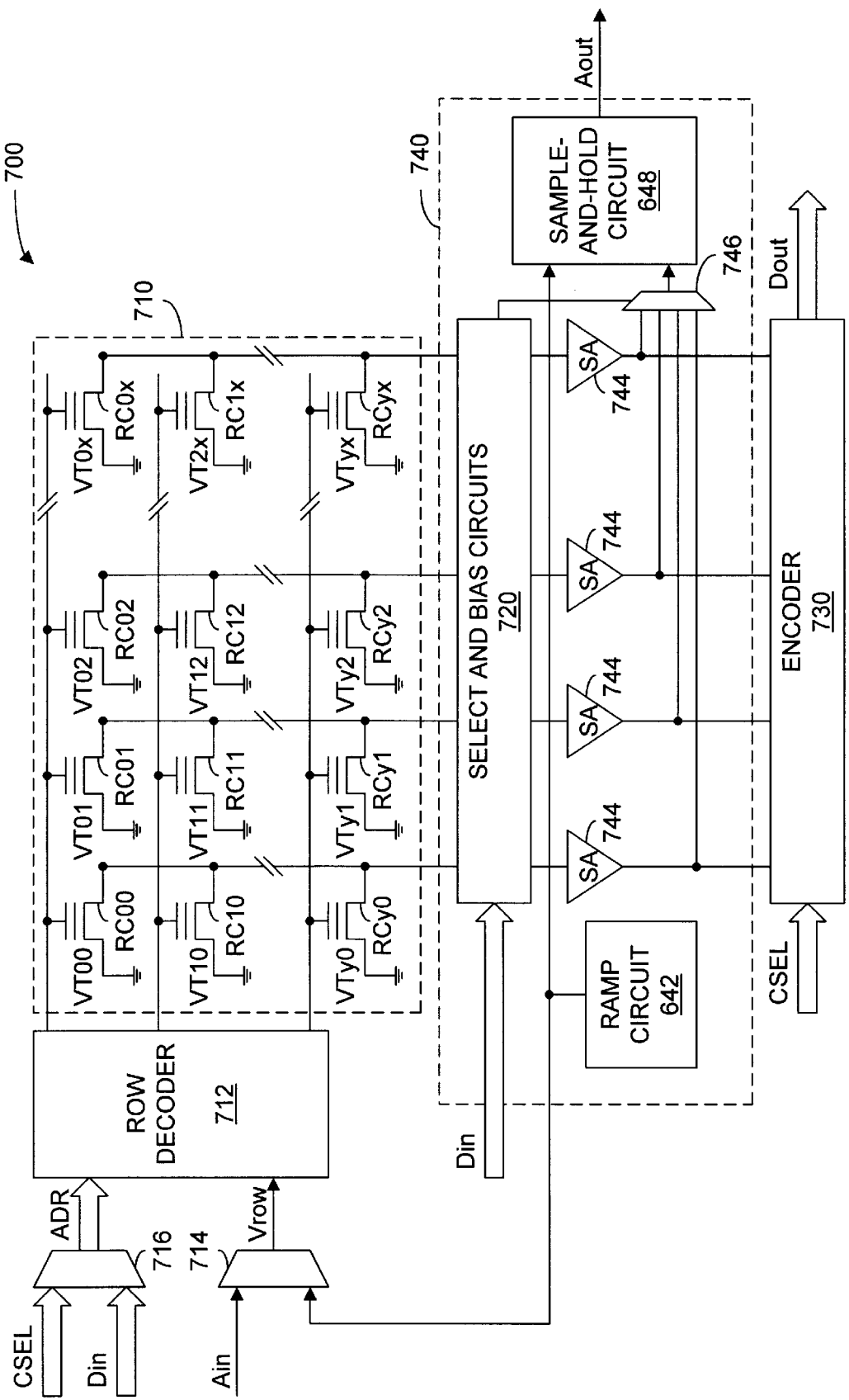
FIGS. 7A and 7B are block diagrams of combined analog-to-digital and digital-to-analog converters that, in accordance with an aspect of the invention, includes a conversion array implementing multiple conversions.

In accordance with another aspect of the invention, an ADC and a DAC can use the same conversion array. FIG. 7A illustrates a combined analog-to-digital and digital-to-analog converter (ADDAC) 700 that includes a single conversion array 710 for both analog-to-digital conversions and digital-to-analog conversions. Array 710 includes rows 0 to y of reference cells RC00 . . . RC0x, RC10 . . . RC1x, . . . , RCy0 . . . RCyx having respective threshold voltages VT00 . . . VT0x, VT10 . . . VT1x, . . . , VTy0 . . . VTyx. Each row 0 to y has a row line which connects to the control gates of all the memory cells in the row. Reference cells RC00 to RCyx are also arranged into x+1 columns of reference cells RC00 . . . RCy0, RC01 . . . RCy1, . . . , RC0x . . . RCyx, where reference cells in a column have their drains coupled together by a column line corresponding to the column. In FIG. 7A, the sources of all of reference cells RC00 to RCyx are grounded, but alternatively, one or more source lines can connect the sources of reference cells RC00 to RCyx to erase circuits.

In one embodiment of ADDAC 700, each row 0 to y in array 710 is associated with a different conversion between analog and digital signals. For example, in row 0, threshold voltages VT00 to VT0x may define a linear conversion such as the threshold voltage relationship of Equation 1 provides, and threshold voltages VT10 to VT1x for row 1 define a nonlinear conversion such as a $\mu$-law or A-law companding conversion. A row decoder 712 selects from array 710 a row identified by a conversion select signal CSEL and applies a signal Vrow from a multiplexer 714 to the selected row. Multiplexer 714 provides analog input signal Ain as signal Vrow during an analog-to-digital conversion and provides a signal Vramp from ramp circuit 442 during a digital-to-analog conversion.

Figure 1:
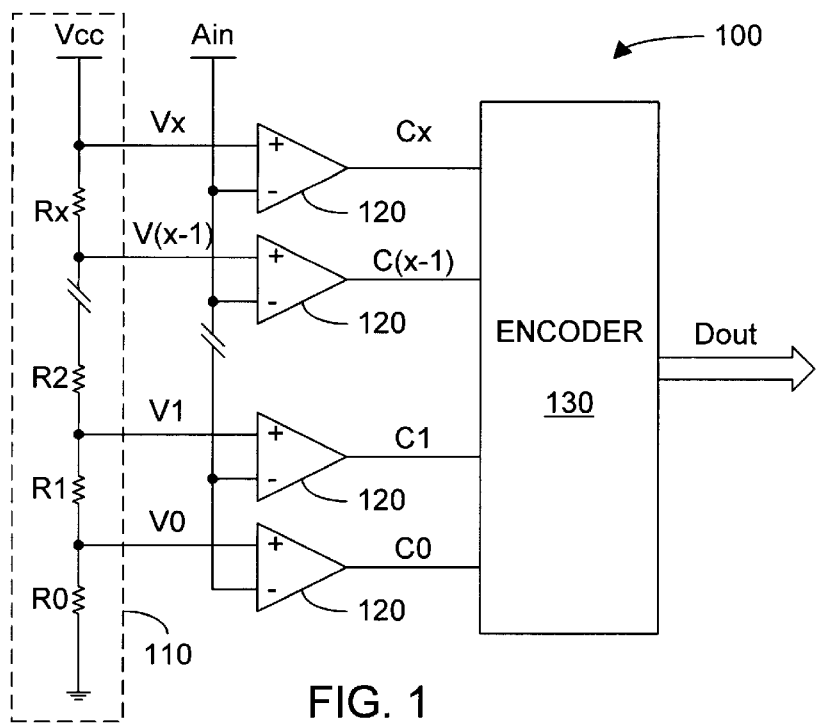
FIG. 1 is a block diagram of a known analog-to-digital converter.
Figure 2:
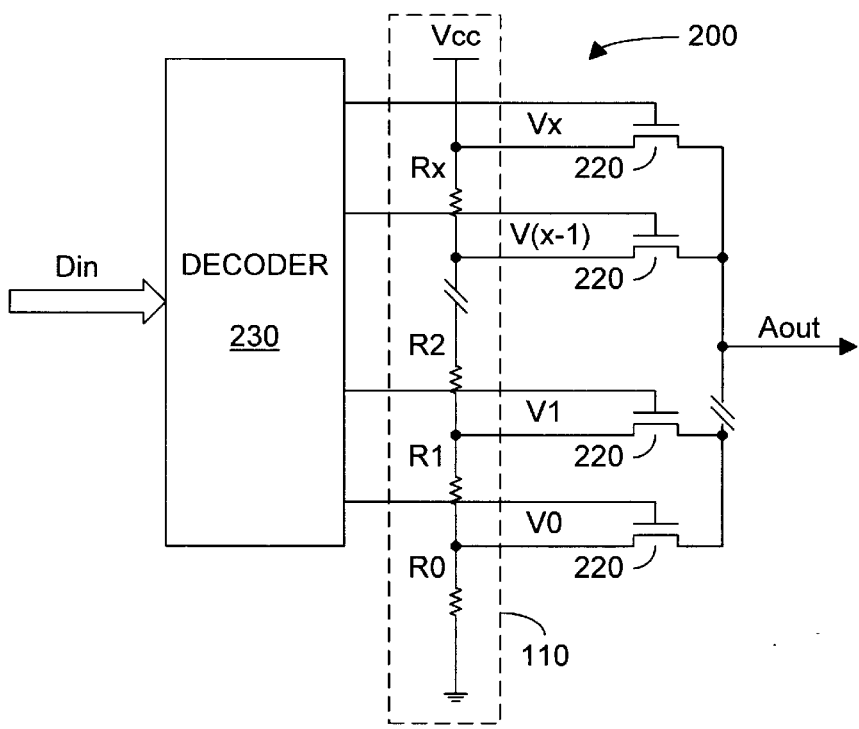
FIG. 2 is a circuit diagram of a known digital-to-analog converter.

To perform an analog-to-digital conversion with ADDAC 700, multiplexer 714 selects analog input signal Ain, and row decoder 712 applies signal Ain to the row line corresponding to the selected conversion. Row decoder 712 biases unselected row lines to a voltage lower than the threshold voltage of any reference cell RC00 to RCyx in array 710 so that none of the reference cells coupled to unselected row lines conduct. Bias circuit 720 biases all of the column lines of array 710 to a positive voltage (typically 1 to 1.5 volts). Sense amplifiers 744 sense which of the column lines of array 710 couple to conductive reference cells, and each sense amplifier 744 asserts a binary signal indicating whether an associated reference cell in the selected row conducts. Encoder 730 generates output digital signal Dout from the binary signals as described above in regard to FIG. 1.

To perform a digital-to-analog conversion, multiplexer 714 selects the signal from ramp circuit 642, and row decoder 712 applies the selected signal from multiplexer 714 to the selected row line. Again, row decoder 712 biases unselected row lines to a voltage lower than the threshold voltage of any reference cell RC00 to RCyx in array 710 so that none of the reference cells coupled to unselected row lines conduct. Selection and bias circuit 720 biases all of the column lines or a selected column line of array 710 to a positive voltage, and each sense amplifier 744 senses whether the attached column line is coupled to a conductive reference cell. To save power, bias circuit 720 biases only the column line having the column address that signal Din indicates. A multiplexer 746 selects the one of sense amplifiers 744 that is coupled to the column line having the column address that signal Din identifies and provides the binary signal from the selected sense amplifier as a trigger signal for sample-and-hold circuit 648. Accordingly, when the conductivity state of the reference cell in the selected row and the selected column changes, sample-and-hold circuit 648 samples the voltage from ramp circuit 642. Sample-and-hold circuit 648 provides the sampled voltage to analog output signal Aout.

In an alternative embodiment of ADDAC 700, multiple rows of array 710 contain reference cells for a single conversion. Using multiple rows for a conversion allows higher resolution analog signals and more bits in digital signals. In particular, an n-bit conversion requires about $2^n$ reference cells, and if the number of cells in a row is less than $2^n$, multiple row can be used for the conversion. Array 710 can still contain reference cells for many different types of conversions.

For an analog-to-digital conversion using the alternative embodiment of ADC 700, signal CSEL initially has a value that selects one of the rows associated with the desired conversion, and circuit 740 determines the conductivity states of the reference cells in the current row. If all of the reference cells in the selected row conduct or do not conduct, control circuitry (not shown) changes signal CSEL to select another row corresponding to the desired conversion. The control circuit continues to change signal CSEL until a row is found in which some reference cells conduct and others don't conduct or until two rows that are consecutive in the conversion, are found where one row contains only conducting reference cells and the other row contains only non-conducting reference cells. Once signal CSEL settles on the appropriate row, encoder 730 determines digital output signal Dout based on signal CSEL and on which reference cells in the selected row conduct. In particular, signal CSEL, which identifies a row, indicates the most significant bits of signal Dout and the conducting reference cells in the selected row indicate the least significant bits of signal Dout.

For a digital-to-analog conversion, signal CSEL selects the conversion (i.e., a set of rows corresponding to the conversion), and the most significant bits of digital input signal Din selects which of the rows corresponding to the conversion. Accordingly, as shown in FIG. 7A, a mixer 716 provides to row decoder 712 an address signal ADR having most significant bits from signal CSEL and least significant bits from signal Din. The least significant bits of digital input signal Din selects which column of array 710 is read to provide analog output signal Aout. In FIG. 7A, the read circuit includes a ramp circuit 642 that multiplexer 714 and row decoder 712 connect to the selected row line.

Figure 7B:
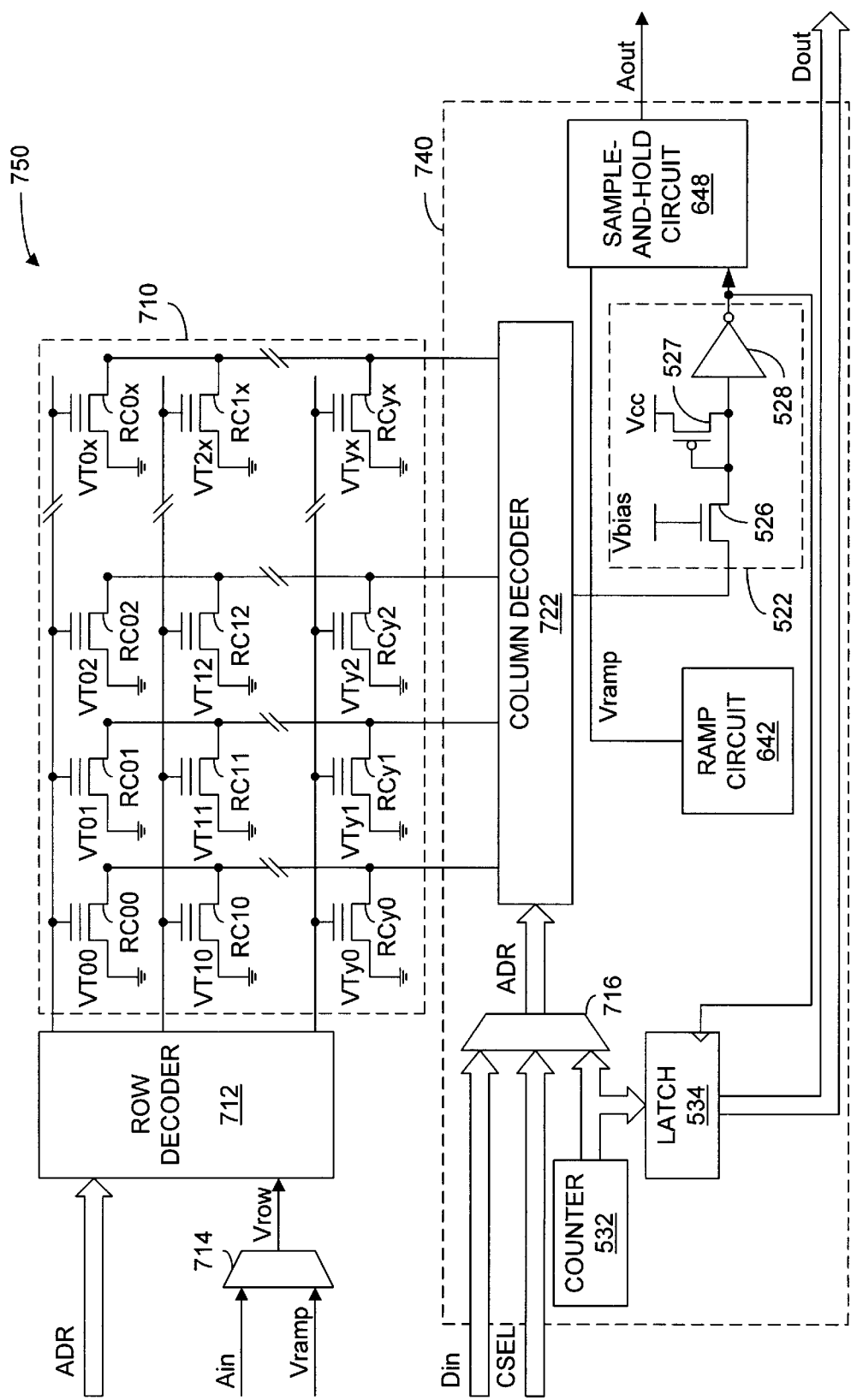

FIG. 7B illustrates an ADDAC 750 which is similar to ADDAC 700 but uses a single sense circuit 522 to save circuit area and power consumption. ADDAC 750 also uses encoding as described above in regard to FIG. 5A. During an analog-to-digital conversion, counter 532 increments through the possible digital values for signal Dout, and signal CSEL identifies a set of the rows associated with the conversion being perform. Accordingly, mixer 716 generates an address signal ADR that is applied to row decoder 712 and a column decoder 722 to sequentially select reference cells corresponding to the conversion. In particular, after a column address to column decoder 722 counts across a row, row decoder 712 changes the row line to which analog input signal Ain is applied. At the dividing point between conductive and non-conductive reference cells, latch 534 registers the count from counter 532 and provides that count as digital output signal Dout. During a digital-to-analog conversion, signal CSEL identifies the set of rows corresponding to a conversion, and digital input signal Din identifies a reference cell that corresponds to the digital input value. Accordingly, address signal ADR from mixer 716 is a combination of signals Din and CSEL that selects the reference cell from the set of row signal CSEL identifies. Column decoder 722 connects that reference cell to sense circuit 522 which triggers sample-and-hold circuit 648 when required to provide analog output signal Aout at the level of the threshold voltage of the target reference cell.

An advantage of ADDACs 700 and 750 is that they can perform both analog-to-digital conversions and digital-to-analog conversions using the same set of reference cells. Accordingly, any variation in the reference cells due to process or operating conditions are common to both conversions, and the analog-to-digital conversion remains the inverse of the digital-to-analog conversion even if the programming is inaccurate.

Although the invention has been described with reference to particular embodiments, the description is only an example of the invention's application and should not be taken as a limitation. Various adaptations and combinations of features of the embodiments disclosed are within the scope of the invention as defined by the following claims.

I claim:

1. A converter comprising:
   a plurality of transistors having a plurality of different threshold voltages;
   an input terminal coupled to apply an analog input signal to the gates of the transistors; and
   an encoder coupled to the transistors, wherein the encoder generates a multi-bit output signal that represents a value that depends on which of the transistors conduct when the analog signal is applied; and
   an array of memory cells that contain the plurality of transistors.

2. The converter of claim 1, wherein:
   the plurality of transistors are in a row of the array;
   the gates of all the transistors are coupled to a row line for the row; and
   the input terminal is coupled to the row line.

3. The converter of claim 1, wherein:
   the plurality of transistors are contained in a plurality of rows of the array;
   the gates of the transistors in each row are coupled to a row line for the row; and
   the converter further comprising a selection circuit coupled to the row lines, wherein the selection circuit selects a row line and applies the analog input signal to the row line selected.

4. The converter of claim 3, wherein each row contains a plurality of the transistors having a sequence of the threshold voltages, and the sequence of threshold voltages for each row differs from the sequences of threshold voltages in other rows.

5. A converter comprising:
   a plurality of transistors having a plurality of different threshold voltages;
   an input terminal coupled to apply an analog input signal to the gates of the transistors;
   an encoder coupled to the transistors, wherein the encoder generates a multi-bit output signal that represents a value that depends on which of the transistors conduct when the analog signal is applied;
   a read circuit capable of reading a threshold voltage of a transistor and generating an analog output signal that has a voltage that indicates the threshold read voltage; and a select circuit coupled to the plurality of transistors and the read circuit, wherein the select circuit selects which of the plurality of transistors the read circuit reads, the selection being according to a digital input signal.

6. A digital-to-analog converter comprising:
   a plurality of transistors having a plurality of different threshold voltages;
   a read circuit capable of reading a threshold voltage of a transistor and generating an output signal that has a voltage that indicates the threshold voltage read; and
   a select circuit coupled to the plurality of transistors and the read circuit, wherein the select circuit selects which of the plurality of transistors the read circuit reads, the selection being according to a multi-bit digital input signal.

7. The converter of claim 6, wherein the multi-bit digital input signal indicates an address for the transistor that the select circuit selects.

8. A converter comprising:
   an array of reference cells, the reference cells having a plurality of threshold voltages;
   a sense circuit coupled to the array; and
   an encoder coupled to the sense circuit, wherein the encoder generates a multi-bit digital output signal that represents a value that depends on which of the reference cells conduct when an analog input signal is applied to a set of reference cells, wherein the encoder comprises a counter coupled to count pulses from the sense circuit, the multi-bit digital output signal being a count of the number of reference calls that conduct.

9. A converter comprising:
   an array of reference cells, the reference cells having a plurality of threshold voltages, wherein the array contains a plurality of rows;
   a sense circuit coupled to the array; and
   an encoder coupled to the sense circuit, wherein the encoder generates a multi-bit digital output signal that represents a value that depends on which of the reference cells conduct when an analog input signal is applied to a set of reference cells; and
   a row decoder coupled to the array, the row decoder selecting a row of reference cells to which the analog signal is applied.

10. The converter of claim 9, further comprising a terminal for a conversion select signal that selects from among a plurality of conversions that the converter implements, the terminal being coupled to provide at least a portion of an address signal to the row decoder.

11. The converter of claim 10, wherein each row in the array corresponds to a different conversion.

12. The converter of claim 10, wherein at least one conversion in the plurality of conversions corresponds to multiple rows in the array.

13. The converter of claim 9, further comprising:
   a column decoder coupled to column lines of the array;
   an input terminal for a digital input signal, the input terminal be coupled to provide a first portion of the digital input signal as a row address signal that the row decoder uses to select a row of the array and to provide a second portion of the digital input signal as a column address signal that the column decoder uses to select a column of the array; and a read circuit coupled to read a threshold voltage of a reference cell in the row selected by the row decoder and the column selected by the column decoder, the read circuit generating an analog output signal having a level according to the threshold voltage of the reference cell read.

14. A converter comprising:

an array of reference cells, the reference cells having a plurality of threshold voltages;

a sense circuit coupled to the array;

an encoder coupled to the sense circuit, wherein the encoder generates a multi-bit digital output signal that represents a value that depends on which of the reference cells conduct when an analog input signal is applied to a set of reference cells; and a selection circuit coupled to select which reference cell in the array is connected to the sense circuit, wherein the encoder comprises:

a counter that provides to the selection circuit a count, the selection circuit using the count as an address for selecting the reference cell connected to the sense circuit; and a latch coupled to register the count from the counter when the select circuit changes from connecting the sense circuit to a reference cell in a first conductivity state to connecting the sense circuit to a reference cell in a second conductivity state.

* * * * *